(12) United States Patent
Kim et al.

(10) Patent No.: US 9,887,246 B2
(45) Date of Patent: Feb. 6, 2018

(54) ORGANIC LIGHT EMITTING DISPLAY PANEL AND DEVICE WITH A BLACK BANK IN A PLANARIZATION LAYER

(71) Applicant: LG DISPLAY CO., LTD., Seoul (KR)

(72) Inventors: Young-Ho Kim, Paju-si (KR); In-Cheol Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/376,384

(22) Filed: Dec. 12, 2016

(65) Prior Publication Data
US 2017/0186823 A1    Jun. 29, 2017

(30) Foreign Application Priority Data

Dec. 28, 2015  (KR) .......................... 10-2015-0187258

(51) Int. Cl.
*H01L 27/32* (2006.01)
*H01L 51/52* (2006.01)

(52) U.S. Cl.
CPC ........ *H01L 27/3213* (2013.01); *H01L 27/322* (2013.01); *H01L 27/3246* (2013.01); *H01L 27/3276* (2013.01); *H01L 51/5237* (2013.01)

(58) Field of Classification Search
CPC ............. H01L 27/3211; H01L 27/3213; H01L 27/3246; H01L 27/322; H01L 27/3283; H01L 27/3206
See application file for complete search history.

(56) References Cited

U.S. PATENT DOCUMENTS

| 2013/0069085 A1* | 3/2013 | Kang | ...................... H01L 51/56 257/88 |
| 2013/0153870 A1* | 6/2013 | Seo | ...................... H01L 51/5262 257/40 |
| 2013/0175512 A1* | 7/2013 | Kim | ...................... H01L 51/5004 257/40 |
| 2014/0001506 A1* | 1/2014 | Park | ...................... G02B 6/0023 257/98 |

FOREIGN PATENT DOCUMENTS

| KR | 10-2011-0029755 A | 3/2011 |
| KR | 10-2015-0059189 | 6/2015 |

\* cited by examiner

*Primary Examiner* — Ermias Woldegeorgis
(74) *Attorney, Agent, or Firm* — Seed IP Law Group LLP

(57) ABSTRACT

An organic light-emitting display panel can improve the color purity and color gamut by reducing optical interference between adjacent pixel areas.

A black bank layer is disposed on a planarization layer, such that it is possible to suppress light emitted from an organic emission layer from being reflected via various paths to be scattered to adjacent pixel areas. In addition, the black bank layer comes in contact with a color filter layer via holes formed in the planarization layer to thereby reduce optical interference between adjacent pixel areas.

In this manner, the color purity and color gamut of displayed images can be improved, and a display device with excellent image quality can be implemented.

15 Claims, 8 Drawing Sheets

ORGANIC LIGHT EMITTING DISPLAY PANEL AND DEVICE WITH A BLACK BANK IN A PLANARIZATION LAYER

BACKGROUND

1. Technical Field

The present disclosure relates to an organic light-emitting display panel and a display device comprising the same. More specifically, the present disclosure relates to an organic light-emitting display panel capable of improving color purity and color gamut by reducing optical interference between adjacent pixel areas, and a display device comprising the same.

2. Description of the Related Art

As the information-oriented society evolves, various demands for display devices are ever increasing. In accordance with this, display devices are being developed and released, with a variety of display panels such as a liquid-crystal display panel, a plasma display panel, an organic light-emitting display panel, etc.

Among these, an organic light-emitting display (OLED) device employing an organic light-emitting display panel is a self-luminance display device. Accordingly, an OLED device, unlike a liquid-crystal display device, does not require a separate light source and thus it can be made lighter and thinner. Further, an organic light-emitting display device can be driven with low voltage and have excellent color reproduction, short response time, wide viewing angle and good contrast ratio. Accordingly, an organic light-emitting display device is widely used recently.

OLED devices may be divided into a RGB display device in which an organic emission layer emitting a different color is disposed in each of pixel areas, and a white emission/color filter (W+CF) display device in which an organic emission layer emitting white light and a color filter defining a different color are disposed in each of pixel areas.

For a RGB organic light-emitting display device, sub-pixel areas corresponding to R, G and B, respectively, are defined on a substrate by using a fine metal mask. As display devices become larger and have higher resolution, such fabricating process using a fine metal mask becomes more difficult. For this reason, white emission/color filter (W+CF) OLED devices are more preferred recently.

White emission/color filter (W+CF) OLED devices may be divided into three-color OLED device in which a red pixel area, a blue pixel area and a green pixel area are defined on a substrate, and four-color OLED device in which a white pixel area, as well as a red pixel area, a blue pixel area and a green pixel area, is defined on a substrate.

Figure 1:
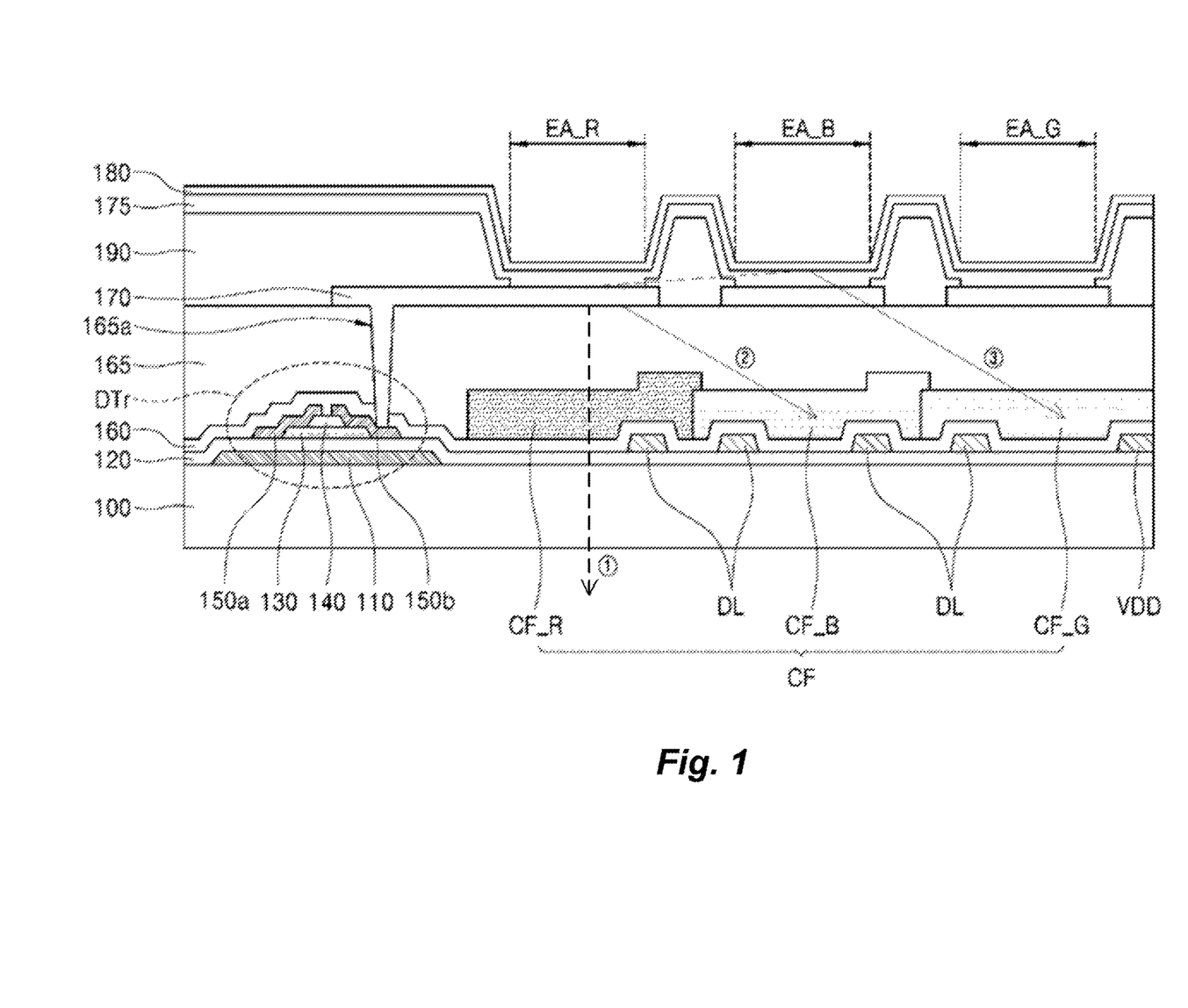
FIG. 1 is a cross-sectional view of an existing three-color (R, G and B) OLED device.
Figure 2:
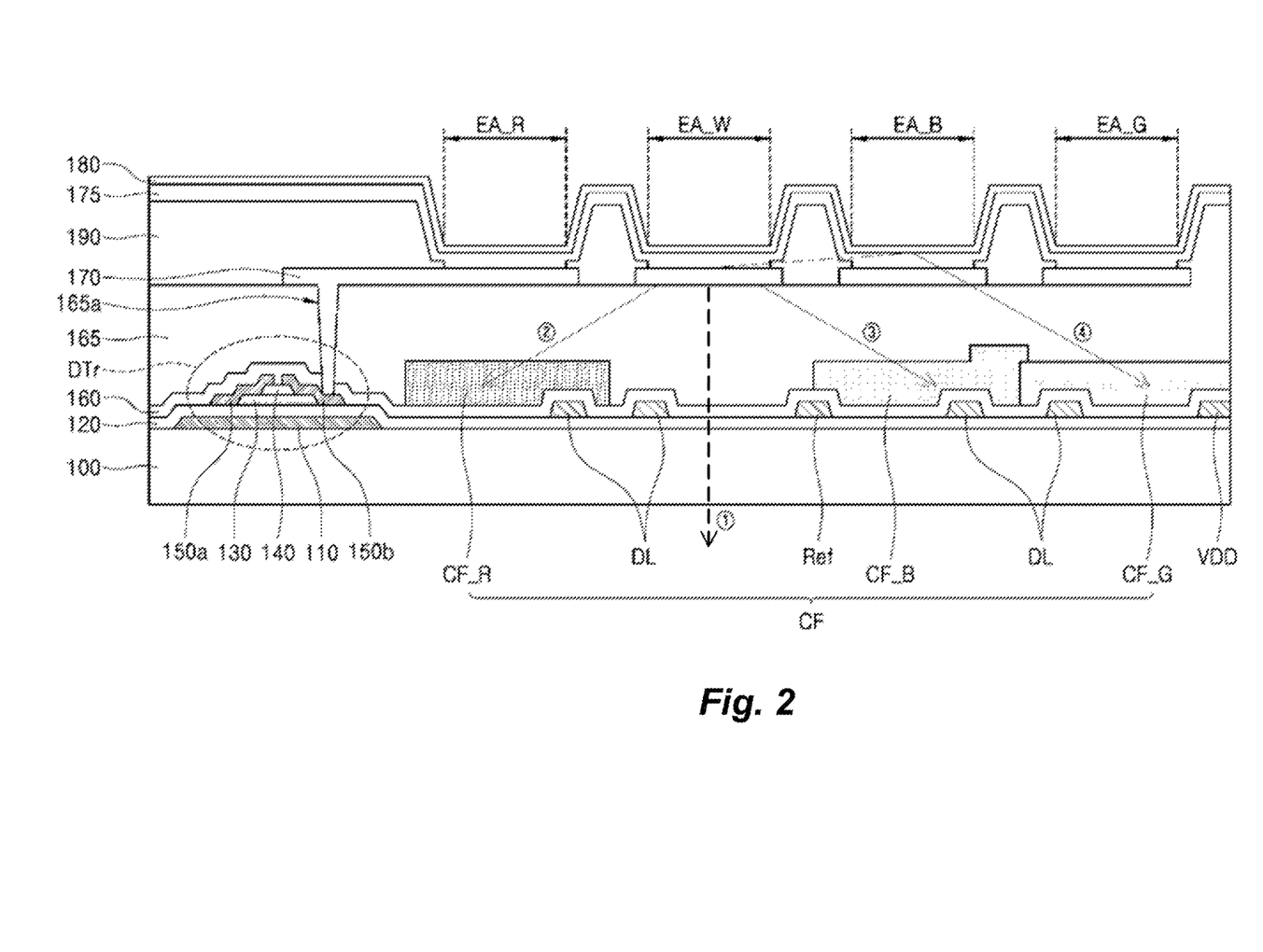
FIG. 2 is a cross-sectional view of an existing four-color (R, W, G, and B) OLED device.

FIG. 1 is a cross-sectional view of an existing three-color OLED device. FIG. 2 is a cross-sectional view of an existing four-color OLED device.

The OLED devices shown in FIG. 1 and FIG. 2 are bottom emission display devices in which light is emitted from an organic emission layer toward a layer that includes a driving thin-film transistor.

Referring to FIG. 1 and FIG. 2, a driving thin-film transistor DTr including a gate electrode 110, an insulation layer 120, a semiconductor layer 130, an etch stopper 140, a source electrode 150a and a drain electrode 150b is disposed on a substrate 100.

Then, a passivation layer 160 is disposed on the driving thin-film transistor DTr. A planarization layer 165 having a hole 165a formed therein is disposed on the passivation layer 160, and a first electrode 170 is formed on the passivation layer 165 and is electrically connected to a drain electrode 150b of the driving thin-film transistor DTr via the hole 165a.

Then, a bank layer 190 is disposed along the edge of the first electrode 170 to cover a part of it. The organic emission layer 175 is disposed on a part of the first electrode 170 exposed between openings of the bank layer 190, and a second electrode 180 is disposed on the organic emission layer 175. The first electrode 170, the organic emission layer 175 and the second electrode 180 define an organic light-emitting element.

The bank layer 190 defines an emission area of each of the pixel areas. The emission area may be a red emission area EA_R, a blue emission area EA_B, a green emission area EA_G depending on the type of a color filter layer in the pixel area. One or more signal lines are extended between two adjacent pixels. The signal lines may be a data line DL, a reference line Ref, or a supply voltage line VDD.

For example, white light emitted from the organic emission layer 175 in the red emission area EA_R passes through a red color filter layer CF-R to become red light, thereby producing red color. In doing so, the white light emitted from the organic emission layer 175 may not pass through the color filter layer CF disposed below the organic emission layer 175, such that the color purity and color gamut may be lowered.

For example, referring to FIG. 1, if all the white light emitted from the organic emission layer 175 in the red emission area EA_R passes through the red color filter layer CF-R as indicated by arrow ①, image quality with high red color purity can be achieved.

On the other hand, if a part of the white light emitted from the organic emission layer 175 in the red emission area EA_R passes through a color filter layer disposed in an adjacent pixel area (or an emission area) as indicated by arrow ②, blue light or green light may be produced even though the red pixel area is driven. As a result, the color purity and color gamut may be lowered, such that the quality of displayed image may be degraded.

In addition, for a bottom-emission OLED device, white light may be emitted from an organic emission layer toward top of the device such that the white light is reflected off a second electrode disposed above the organic emission layer to be scattered in random directions. Some of the scattered white light may pass through a color filter layer disposed in a pixel area or an emission area adjacent to a red pixel area such that blue or green color may be produced instead of red color, as indicated by arrow ③. As a result, the color purity and color gamut may be lowered. In particular, a transparent bank layer may transmit incident light, and thus an OLED device employing a transparent bank layer is vulnerable to the above-described problem.

In addition, the same problem may take place in the four-color OLED device shown in FIG. 2 as well.

When all the white light emitted from an organic emission layer 175 disposed in a white emission area EA_W with no color filter layer passes through a planarization layer 165 to propagate toward the bottom of the device as indicated by arrow ①, white light can be produced.

On the other hand, if a part of the white light emitted from the organic emission layer 175 in the white emission area EA_W passes through a color filter layer disposed in an adjacent pixel area or an emission area as indicated by arrows ② and ③, red light or blue light may be produced even though the white pixel area is driven. Moreover, a part of the scattered white light may skip a pixel area to pass through a green color filter layer, as indicated by arrow ④.

If a color filter layer is mislocated during a process of depositing a color filter layer due to processing deviation, the above-described problem may become even worse depending on the location and angle of the incident light on the color filter layer.

SUMMARY

In accordance with some aspects of the present disclosure, there is provided to provide an organic light-emitting display panel that prevents the color purity and color gamut from being lowered as light emitted from an organic emission layer in a pixel area passes through a color filter layer disposed in an adjacent pixel area, and an OLED device employing the same.

In accordance with some aspects of the present disclosure, there is provided an organic light-emitting display panel that improves the color purity and color gamut of display images by blocking scattered light that is emitted from an organic emission layer to be reflected off an electrode, and an OLED device employing the same.

In accordance with some aspects of the present disclosure to provide an organic light-emitting display panel that suppresses light leakage occurring when light exits between two adjacent pixel areas where no color filter layer is disposed, and an OLED device employing the same.

In accordance with one aspect of the present disclosure, there are provided an organic light-emitting display panel capable of preventing light emitted from an organic emission layer from being reflected off an electrode to be scattered to an adjacent pixel area by way of disposing a black bank layer on a planarization layer, and an OLED device including the same.

In accordance with another aspect of the present disclosure, there are provided an organic light-emitting display panel capable of absorbing light emitted from an organic emission layer to propagate toward an adjacent pixel area by bringing the black bank layer into contact with color filter layers via holes formed in the planarization layer, and an OLED device including the same.

In accordance with one aspect of the present disclosure, there are provided an organic light-emitting display panel capable of suppressing the color shading of light that is not absorbed by the black bank layer but propagates toward the ends of the color filter layers by way of overlapping ends of the color filter layers above signal lines between two adjacent pixel areas, and an OLED device including the same.

According to an exemplary embodiment of the present disclosure, a black bank layer is disposed on a planarization layer to absorb incident light on the black bank layer via various reflection paths, such that optical interference between adjacent pixel areas can be reduced.

According to an exemplary embodiment of the present disclosure, a black bank layer disposed on either an electrode or the planarization layer that penetrates the planarization layer to come in contact with color filter layers, such that light that is emitted from an organic emission layer in a pixel area to propagate toward a color filter layer in an adjacent pixel area can be blocked, thereby improving color purity and color gamut of displayed images.

According to an exemplary embodiment of the present disclosure, color filter layers of two adjacent pixel areas overlap each other above signal lines, such that light leakage occurring when light exits without passing through color filter layers can be suppressed. As a result, the image quality can be further improved.

DETAILED DESCRIPTION

Hereinafter, a display panel according to exemplary embodiments of the present disclosure and a display device including the display panel will be described in detail with reference to the accompanying drawings.

Typically, display devices may be divided into a top-emission display device and a bottom-emission display device, depending on the direction in which light exits.

In the following description, a bottom-emission display device will be described as an example of a display device according to an exemplary embodiment of the present disclosure for convenience of illustration. However, it is to be understood that the essential features will be equally applied to a top-emission display device as well.

Figure 3:
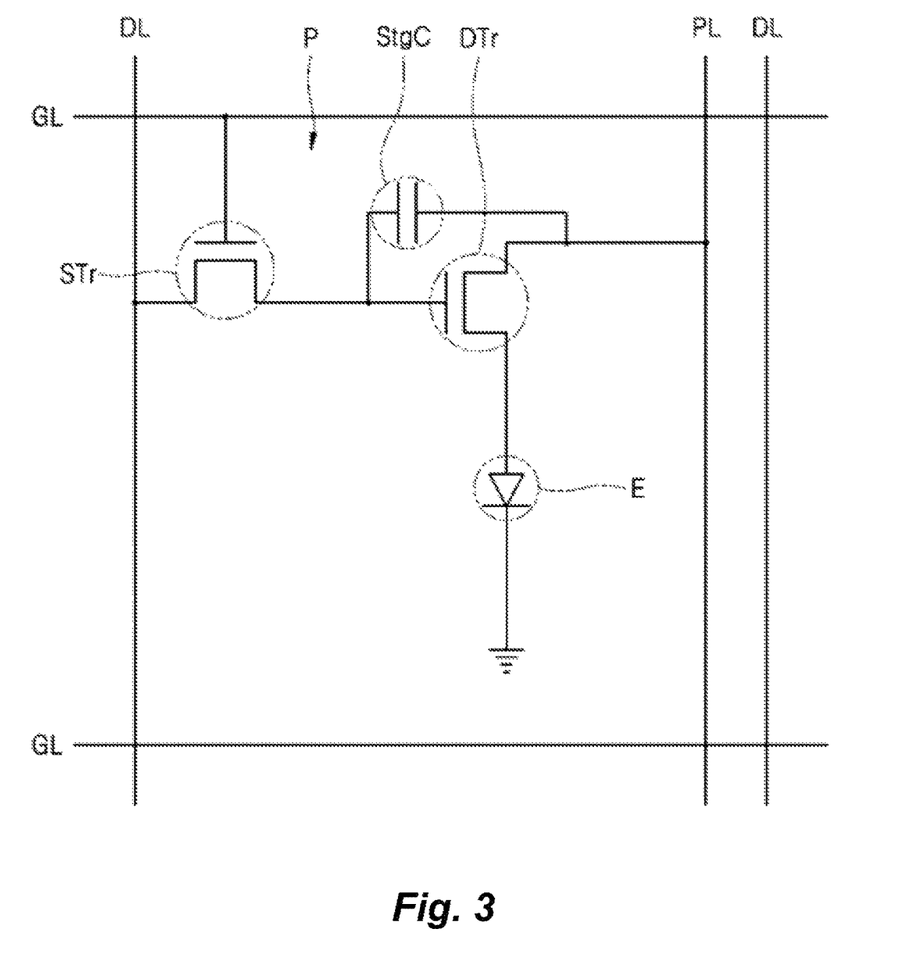
FIG. 3 is an equivalent circuit diagram of a pixel area of an organic light-emitting display (OLED) device according to an exemplary embodiment of the present disclosure.

FIG. 3 is an equivalent circuit diagram of a pixel area of an organic light-emitting display (OLED) device according to an exemplary embodiment of the present disclosure. Hereinafter, a way of driving the circuit of the pixel area of the OLED device will be described in detail with reference to FIG. 3.

Referring to FIG. 3, gate lines GL and data lines DL intersect each other to define a pixel area P. In the pixel area P, a switching thin-film transistor STr, a driving thin-film transistor DTr, and an organic light-emitting element E are disposed.

The switching thin-film transistor STr is connected to a gate line GL and a data line DL. The gate electrode of the driving thin-film transistor DTr is connected to the drain electrode of the switching thin-film transistor STr.

The source electrode of the driving thin-film transistor DTr is connected to a power line PL, and the drain electrode of the driving thin-film transistor DTr is connected to a first electrode of the organic light-emitting element E. In the pixel area P, a storage capacitor StgC may be disposed between the gate electrode and the source electrode of the driving thin-film transistor DTr.

When a turn-on voltage is applied to the gate line GL, the switching thin-film transistor STr is turned on, and accordingly a data voltage on the data line DL is output to be applied to the gate electrode of the driving thin-film transistor DTr.

The amount of the current flowing through a channel of the driving thin-film transistor DTr is determined depending on the magnitude of the data voltage applied to the gate electrode, and the brightness of the light emitted from the organic light-emitting element E varies depending on the amount of the current.

Figure 4:
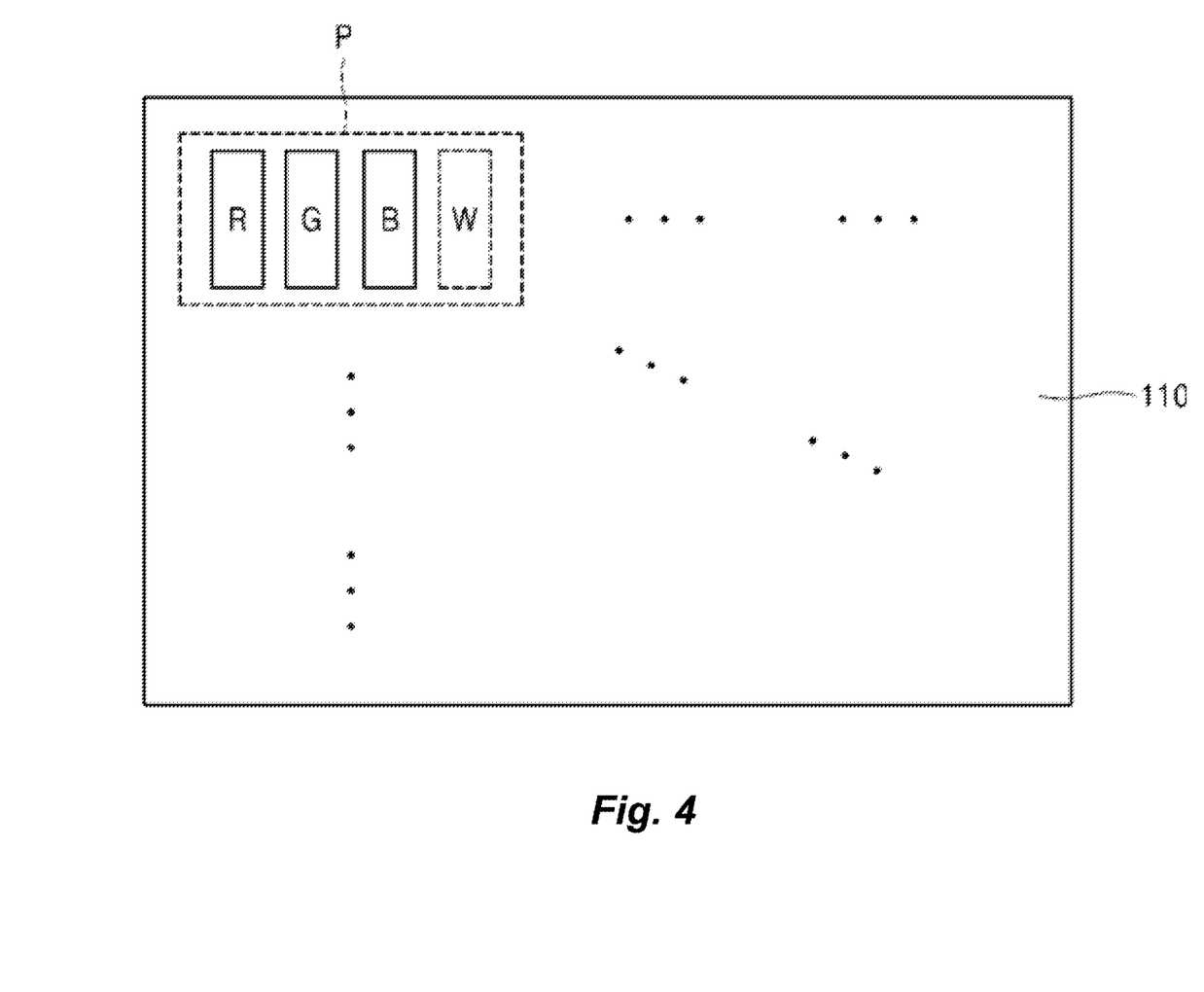
FIG. 4 is a diagram schematically showing a layout of pixel areas of an organic light-emitting display (OLED) device according to an exemplary embodiment of the present disclosure.

FIG. 4 is a diagram schematically showing a layout of pixel areas. An OLED device according to an exemplary embodiment of the present disclosure may include a red pixel area producing red light, a blue pixel area producing blue light, and a green pixel area producing green light.

In addition, according to another exemplary embodiment of the present disclosure, the OLED device may further include a white pixel area emitting white light, such that the brightness of displayed images can be further improved. The organic light-emitting element disposed in each of the pixel areas may be a white light-emitting element generating white light.

As shown in FIG. 4, the pixel areas may be arranged sequentially in a row direction. In addition, the pixel areas may also be arranged in a quad topology in which pixel areas are arranged in two rows and two columns to form a group. The sequence and topology of the pixel areas may be changed as desired.

Figure 5:
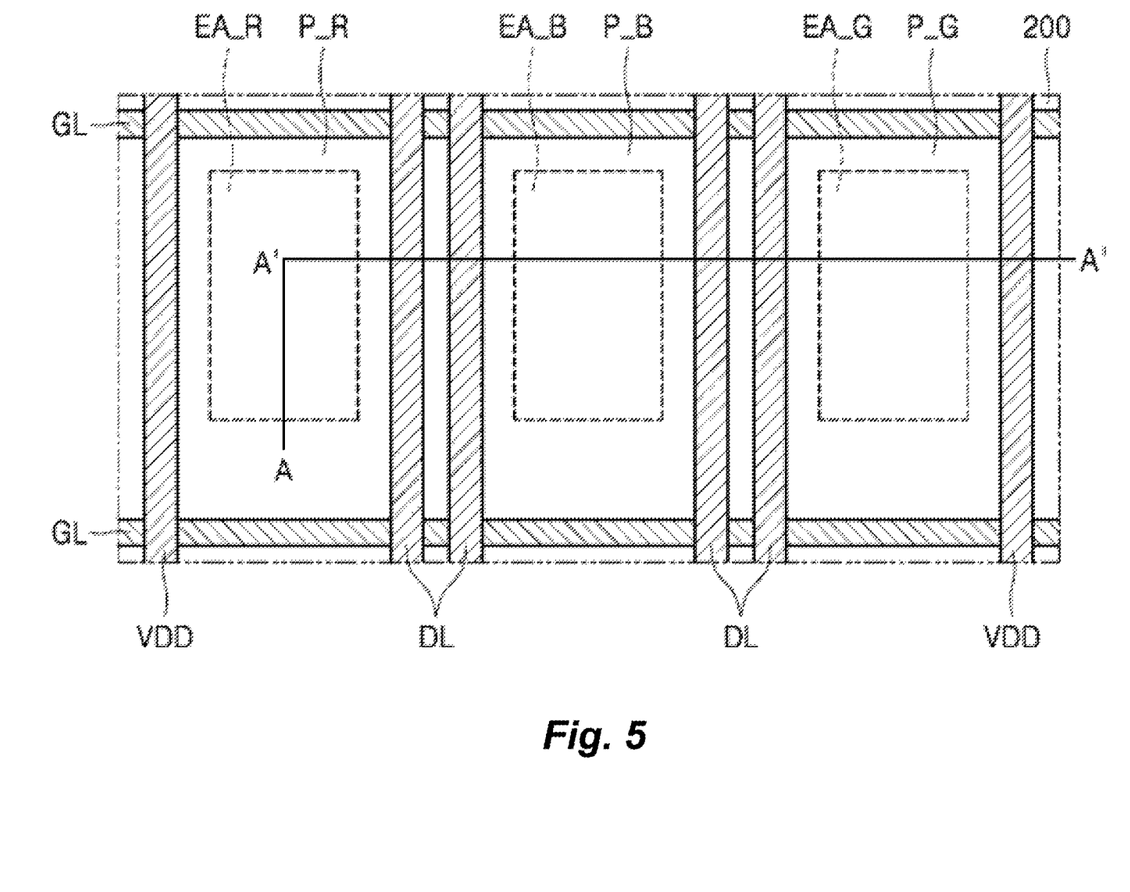
FIG. 5 is an enlarged view of the pixel area P shown in FIG. 4, which is a plan view of a pixel area of three-color (R, G and B) OLED device.

FIG. 5 is an enlarged view of the pixel area P shown in FIG. 4, which is a plan view of a pixel area of three-color (R, G and B) OLED device.

Referring to FIG. 5, signal lines including gate lines GL, data lines DL and supply voltage lines VDD are disposed on a substrate 200. The gate lines GL intersect the data lines DL and the supply voltage lines VDD.

According to the exemplary embodiment, a red pixel area P_R, a blue pixel area P_B and a green pixel area P_G are defined on the substrate 200. Each of the pixel areas may be defined by the above-described signal lines.

For example, the red pixel area P_R and the green pixel area P_G may be defined by two gate lines GL in parallel and supply voltage lines VDD and data lines DL intersecting the gate lines GL.

In addition, the blue pixel area P_B may be defined by two gate lines GL in parallel and two data lines DL intersecting the gate lines GL.

The sequence of the pixel areas and the type and number of the signal lines passing through the pixel areas may vary depending on design choice.

The red pixel area P_R, the blue pixel area P_B and the green pixel area P_G defined on the substrate 200 include a red emission area EA_R, a blue emission area EA_B and a green emission area EA_G, respectively.

The red emission area EA_R, the blue emission area EA_B and the green emission area EA_G may be defined as areas not covered by a black bank layer. That is, the rest of the area except the red emission area EA_R, the blue emission area EA_B and the green emission area EA_G may covered by the black bank layer.

Figure 6:
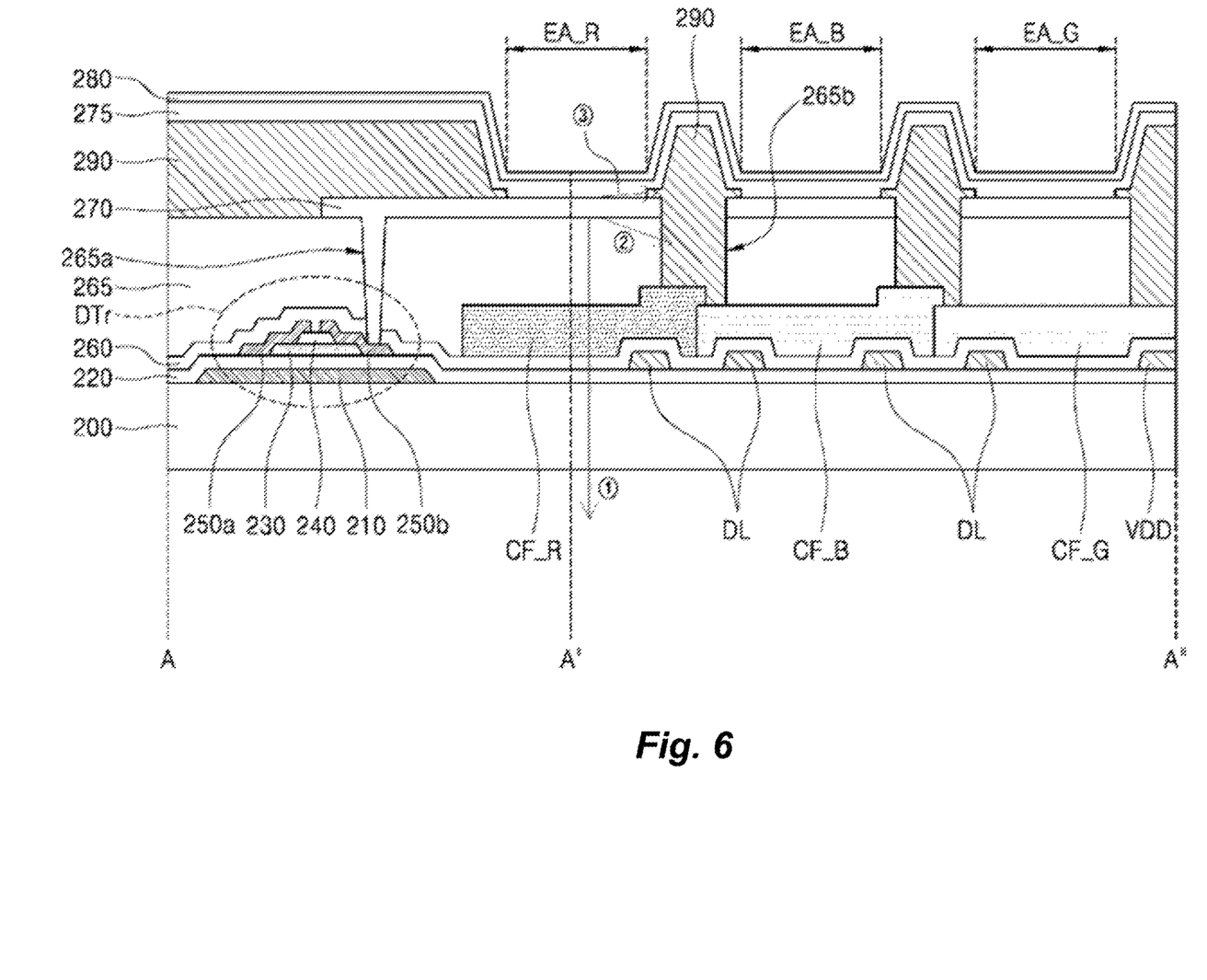
FIG. 6 is a cross-sectional view of the OLED device taken along line A-A" of FIG. 5.

FIG. 6 is a cross-sectional view of the OLED device taken along line A-A" of FIG. 5.

Specifically, the cross section taken along line A-A' shows an area where the driving thin-film transistor DTr of the OLED device according to an exemplary embodiment of the present disclosure is disposed. In addition, the cross section taken along line A'-A" shows an emission area of the OLED device according to an exemplary embodiment of the present disclosure.

Referring first to the cross section taken along line A-A', a gate electrode 210 is disposed on a substrate 200, and the gate electrode 210 and the part of the upper surface of the substrate 200 where the gate electrode 210 is not disposed are covered by an insulation layer 220. The insulation layer 220 may be a silicon oxide layer, a silicon nitride layer or a stack thereof.

On the insulation layer 220, a semiconductor layer 230 and an etch stopper 240 are disposed above the gate electrode 210. A source electrode 250a and a drain electrode 250b are disposed on either side of the semiconductor layer 230, respectively, and are electrically connected to the semiconductor layer 230.

The gate electrode 210, the insulation layer 220, the semiconductor layer 230, the source electrode 250a and the drain electrode 250b form the driving thin-film transistor DTr.

Then, a passivation layer 260 is disposed on the driving thin-film transistor DTr. The passivation layer 260 may be made of inorganic insulating material such as silicon oxide and silicon nitride, or organic insulating material such as photoacryl or benzocyclobutane.

A planarization layer 265 having a first hole 265a formed therein is disposed on the passivation layer 260, and a first electrode 270 is formed on the passivation layer 265 and is electrically connected to a drain electrode 250b of the driving thin-film transistor DTr via the first hole 265a. The planarization layer 265 may also be made of an inorganic insulating material or an organic insulating material, like the above-described insulation layer 220 or the passivation layer 260.

As described above, in order to define the emission area of each of the pixel area, a black bank layer 290 is disposed along the edge of the first electrode 270 to cover a part of it. An organic emission layer 275 is disposed on the part of the first electrode 270 exposed via the opening of the black bank layer 290, and a second electrode 280 is disposed on the organic emission layer 275. The first electrode 270, the organic emission layer 275 and the second electrode 280 define an organic light-emitting element.

The black bank layer 290 is made of a material that can absorb light. The black bank layer 290 can prevent light emitted from the organic emission layer 275 from being reflected via various paths to be scattered to adjacent pixel areas.

In particular, the black bank layer 290 may absorb light emitted from the organic emission layer 275 to propagate obliquely toward the second electrode 280 as indicated by arrow ③, thereby reducing optical interference with adjacent pixel areas.

The black bank layer 290 may be made of an organic material and/or inorganic material having a low optical density. For example, the black bank layer 290 may be made of a black matrix or a resin containing a black pigment.

In addition, the black bank layer 290 may be made of an ink comprising a black pigment, a binder resin, a solvent and a dispersant. The black pigment may include carbon black, channel black, furnace black, thermal black or lamp black.

Referring next to the cross section taken along line A'-A", the insulation layer 220 disposed on the substrate 200, and signal lines are disposed on the insulation layer 220 to define the pixel areas. For example, two data lines DL may be disposed between a red emission area EA_R and a blue emission area EA_B, and between the blue emission area EA_B and a green emission area EA_G.

The emission area may be defined as the red emission area EA_R, the blue emission area EA_B or the green emission area EA_G depending on the type of a color filter layer in the pixel area. Color filter layers CF_R, CF_B and CF_G are disposed on the passivation layer 260 disposed on the data line DL and the supply voltage line VDD. The term "color filter layers" as used herein is sufficiently broad to include multiple layers that are generally in the same physical plane, each being a different color filter layer or just one layer having different color filters in that line in a single plane. For example, as can be seen viewing FIGS. 6 and 8, the color filters CF_R, CF_B and CF_G could be described to each be their own layer even though they are in generally the same physical plane since they may overlay each other if they overlap. However, in some alternative designs, (not shown herein since such alternative designs are well known) the color filters CF_R, CF_B and CF_G could all be in exactly the same physical plane and in what might appear to be a single common layer having separate sections in that same layer and plane, and would also fall within the meaning of the term "color filter layers" as used in this disclosure.

A planarization layer 265 is disposed over the color filter layers CF_R, CF_B and CF_G Second holes 265b are formed in the planarization layer 265, via which the color filter layers disposed above the one or more signal lines between adjacent pixel areas or emission areas are exposed.

Accordingly, the black bank layer 290 comes in contact with the color filter layer exposed via the second holes 265b.

For example, when light emitted from the organic emission layer 275 in the red emission area EA_R passes through the red color filter layer CF-R as indicated by arrow ①, a red color can be produced. On the other hand, if light emitted from the organic emission layer 275 in the red emission area EA_R passes through other color filter layers disposed in other pixel areas as indicated by arrows ② and ③, different colors may be produced even when the red pixel area is driven.

In view of the above, according to the exemplary embodiment of the present disclosure, the black bank layer 290 and the color filter layers come in contact with each other above the signal lines, i.e., between two adjacent pixel areas or the emission areas, such that light that is reflected off the second electrode 280 and/or passes through the planarization to propagate to adjacent pixel areas can be absorbed. In this manner, the color purity and color gamut of displayed images can be improved.

In addition, according to an exemplary embodiment of the present disclosure, the second holes 265b may expose ends of the color filter layers of two adjacent pixel areas. The black bank layer 290 may come in contact with two color filter layers exposed via the second hole 265b.

During a process of fabricating a large OLED display panel, some of color filter layers are deposited on the left side and the others are deposited on the right side. In doing so, there may be a difference between the position of the color filter layers deposited on the left side and that on the right side due to a deviation in deposition process. When this happens, light may propagate obliquely toward the color filter layers at the boundary between two color filter layers, and thus color shading is likely to occur between left and right sides.

In this regard, according to the exemplary embodiment of the present disclosure, the black bank layer 290 comes in contact with both of the two color filter layers exposed via the second hole 265b, it is possible to prevent the light propagating toward the ends of the color filter layers as indicated by arrow ② from propagating to an adjacent pixel area via the planarization layer 265. In addition, it is possible to suppress color shading between left and right sides by absorbing some of the light propagating obliquely toward the boundary between the two color filter layers.

In addition, according to an exemplary embodiment of the present disclosure, the ends of the two color filter layers exposed via the second hole 265b may overlap with each other.

For example, referring to FIG. 6, the end of the red color filter layer CF_R overlaps the end of the blue color filter layer CF_B, and the opposed end of the blue color filter layer CF_B overlaps the end of the green color filter layer CF_G.

In particular, it is desired that the ends of the two color filter layers overlap each other above the sign lines between the two adjacent pixel areas.

Even though no organic emission layer is disposed above the signal lines between two adjacent pixel areas, light emitted from the organic emission layers of the two pixel areas obliquely may pass near the signal lines, such that light may exit the display device, i.e., light leakage may occur.

In this regard, according to the exemplary embodiment of the present disclosure, two color filter layers are disposed above the signal lines between the two adjacent pixel areas such that the ends of the two color filter layers overlap each other. As a result, the light emitted from the organic emission layers obliquely does not pass through the color filter layer, such that light leakage may be suppressed.

In addition, when the light emitted from the organic emission layers obliquely passes near the signal lines, the light passes through the color filter layer in the pixel area where the organic emission layer is disposed. As a result, the color purity and color gamut of the displayed images can be improved.

Figure 7:
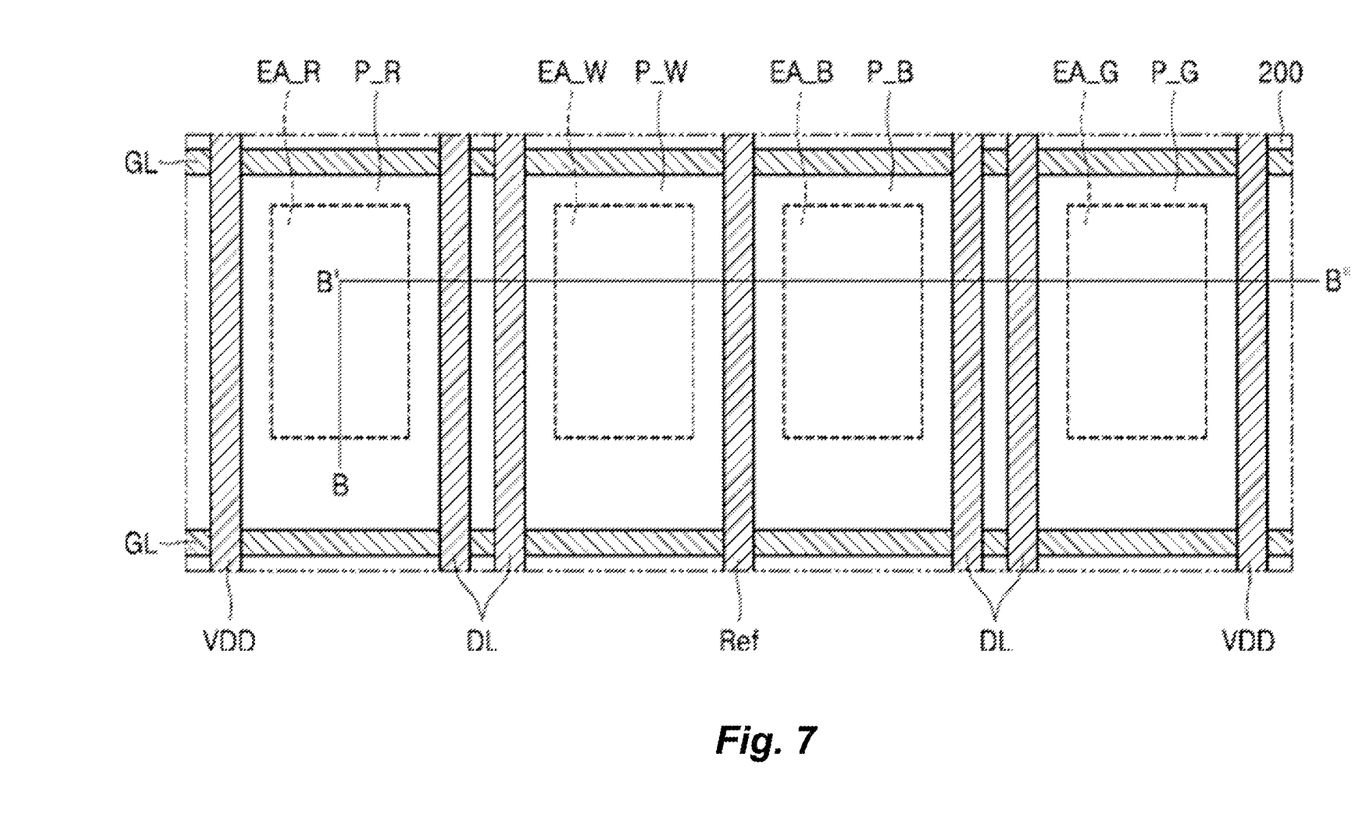
FIG. 7 is an enlarged view of the pixel area P shown in FIG. 4, which is a plan view of a pixel area of four-color (R, G, B and W) OLED device.

FIG. 7 is an enlarged view of the pixel area P shown in FIG. 4, which is a plan view of a pixel area of four-color (R, B and W) OLED device.

Referring to FIG. 7, signal lines including gate lines GL, data lines DL, a reference line Ref, and supply voltage lines VDD are disposed on a substrate 200. The gate lines GL intersect the data lines DL, the reference line Ref, and the supply voltage lines VDD.

According to the exemplary embodiment, a red pixel area P_R, a white pixel area P_W, a blue pixel area P_B and a green pixel area P_G are defined on the substrate 200. Each of the pixel areas may be defined by the above-described signal lines.

For example, the red pixel area P_R and the green pixel area P_G may be defined by two gate lines GL in parallel and supply voltage lines VDD and data lines DL intersecting the gate lines GL, each of which may be considered a signal line.

In addition, the white pixel area P_W and the blue pixel area P_B may be defined by two gate lines GL in parallel and two data lines DL and the reference line Ref intersecting the gate lines GL.

The sequence of the pixel areas and the type and number of the signal lines passing through the pixel areas may vary depending on design choice.

The red pixel area P_R, the white pixel area P_W, the blue pixel area P_B and the green pixel area P_G defined on the substrate 200 include a red emission area EA_R, a white emission area EA_W, a blue emission area EA_B and a green emission area EA_G, respectively.

The red emission area EA_R, the white emission area EA_W, the blue emission area EA_B and the green emission area EA_G may be defined as areas not covered by a black bank layer. That is, the rest of the area except the red emission area EA_R, the white emission area EA_W, the blue emission area EA_B and the green emission area EA_G may covered by the black bank layer.

Figure 8:
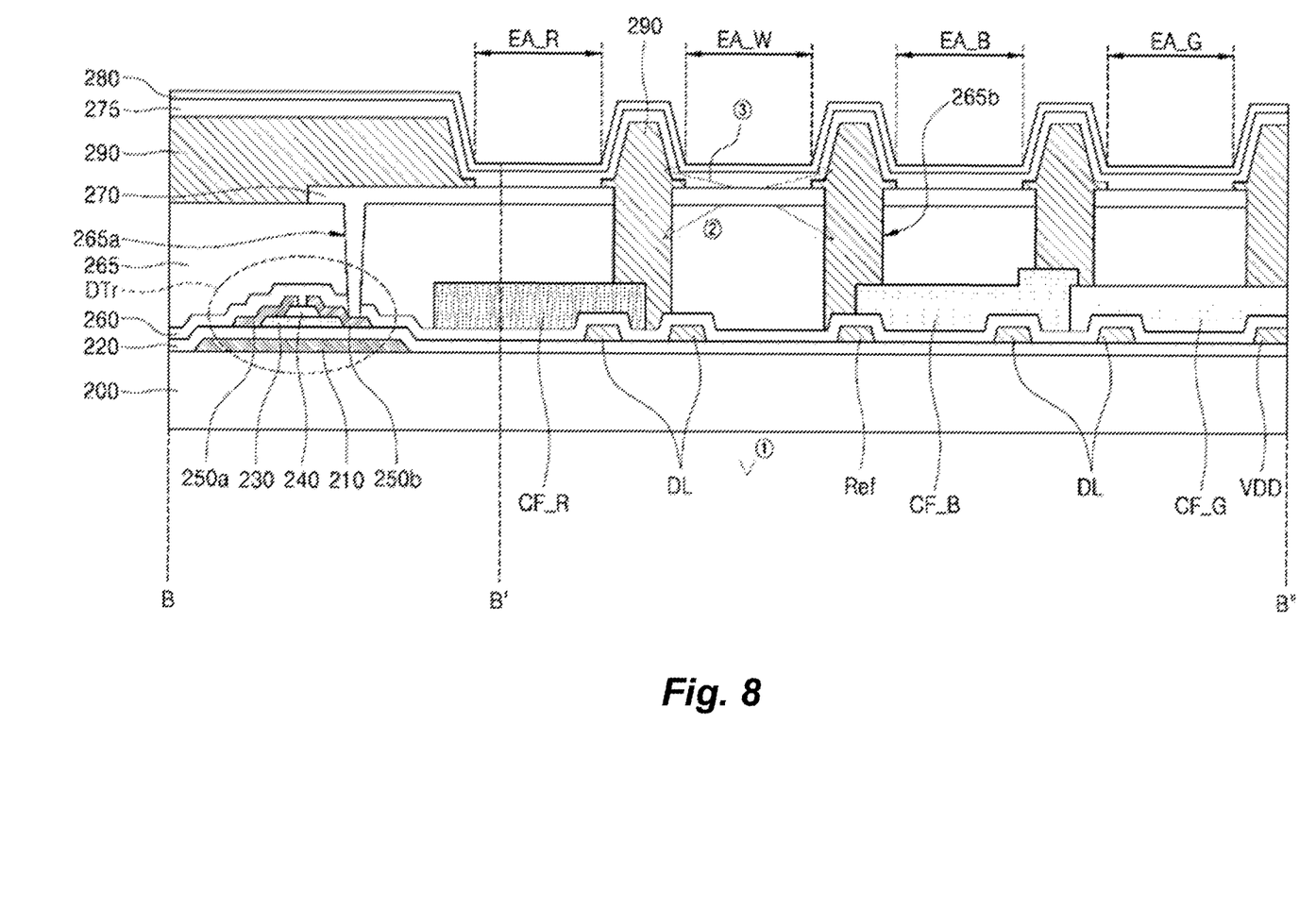
FIG. 8 is a cross-sectional view of the OLED device taken along line B-B" of FIG. 7.

FIG. 8 is a cross-sectional view of the OLED device taken along line B-B" of FIG. 7.

Specifically, the cross section taken along line B-B' shows an area where the driving thin-film transistor DTr of the OLED device according to an exemplary embodiment of the present disclosure is disposed. In addition, the cross section taken along line B'-B" shows an emission area of the OLED device according to an exemplary embodiment of the present disclosure. In the following description, the features already described above with respect to FIG. 5 and FIG. 6 will not be described.

A second holes 265b are formed in the planarization layer 265, via which the color filter layers disposed on the one or more signal lines between adjacent pixel areas or emission areas are exposed.

Referring to FIG. 8, one of the second hole 265b exposes an end of the red color filter layer CF_R above two data lines DL between the red emission area EA_R and the white emission area EA_W. In addition, another of the second holes 265b exposes an end of the blue color filter layer CF_B above the reference line Ref between the white emission area EA_W and the blue emission area EA_B. Additionally, another of the second holes 265b exposes the blue color filter layer CF_B and the green color filter layer CF_G above two data lines DL between the blue emission area EA_B and the green emission area EA_G.

As the end of the blue color filter layer CF_B overlaps the end of the green color filter layer CF_G in the exposed area via the second hole 265b (between the two data lines DL), such that light leakage can be suppressed, which occurs when light passing between the blue emission area EA_B and the green emission area EA_G exits the display device without passing through color filter layers.

In addition, the color filter layers are overlapped so that light obliquely emitted from an organic emission layer of a pixel area passes through a color filter layer of the pixel area firstly when the light passes between the blue emission area EA_B and the green area EA_G. As a result, the color purity and color gamut of the displayed images can be improved.

On the other hand, no color filter layer is disposed in the white emission area EA_W, and the planarization layer 265 comes in contact with the passivation layer 260 in the white emission area EA_W. Accordingly, light emitted from the organic emission layer 275 in the white emission area EA_W sequentially passes through the planarization layer 265, the passivation layer 260, and the insulation layer 220 and a substrate 200, as indicated by arrow ①, to produce white light.

As shown in FIG. 8, if the white emission area EA_W is disposed between the red emission area EA_R and the blue emission area EA_B, the planarization layer 265 is located between the red color filter layer CF_R and the blue color filter layer CF_B.

Accordingly, the second hole 265b formed between the red emission area EA_R and the white emission area EA_W may expose one end of the red color filter layer CF_R only. The second hole 265b formed between the blue emission area EA_B and the white emission area EA_W may expose one end of the blue color filter layer CF_B only (the end that does not overlap the green color filter layer CF_G).

The black bank layer 290 may cover the end of the red color filter layer CF_R exposed via the second hole 265b formed between the red emission area EA_R and the white emission area EA_W. The black bank layer 290 may cover the end of the blue color filter layer CF_B exposed via the second hole 265b formed between the blue emission area EA_B and the white emission area EA_W.

Accordingly, the black bank layer 290 may absorb light that is emitted from the organic emission layer 275 in the red emission area EA_R to propagate toward the white emission area EA_W or that is emitted from the organic emission layer 275 in the blue emission area EA_B to propagate toward the white emission area EA_W, thereby suppressing optical interference between adjacent pixel areas.

In addition, the black bank layer 290 may absorb light that is emitted from the organic emission layer 275 in the white emission area EA_W to propagate toward the red emission area EA_E or the blue emission area EA_B as indicated by arrows ② and ③, thereby suppressing optical interference between adjacent pixel areas.

Although the black bank layer 290 comes in contact with the end of the red color filter CF_R and the passivation layer 260 in FIG. 8, the second holes 265b may be formed to have a depth so that only the red color filter CF_R is exposed, and accordingly the black bank layer 290 may come in contact with the end of the red color filter CF_R and the planarization layer 265.

In addition, according to a modification, the black bank layer 290 may come in contact only with the red color filter layer CF_R. As used herein, the phase "the black bank layer 290 comes in contact with a color filter" means that "the bottom surface of the black bank layer 290 occupying a second hole 265b meets a color filter."

Although the exemplary embodiments of the present disclosure have been described for illustrative purposes, those skilled in the art will appreciate that various modifications, additions and substitutions are possible without departing from the scope and spirit of the present disclosure. Accordingly, it will be understood that such modifications, additions and substitutions also fall within the scope of the present disclosure.

What is claimed is:

1. An organic light-emitting display panel comprising:
    a substrate having a red pixel area, a blue pixel area and a green pixel area defined thereon;
    one or more signal lines disposed on the substrate between two adjacent pixel areas;
    a passivation layer disposed on the signal lines;
    color filter layers disposed on the passivation layer;
    a planarization layer disposed over the color filter layers;
    a plurality of holes formed in the planarization layer that expose the color filter layers, one hole of the plurality of holes being aligned to overlie at least a portion of one signal line of the one or more signal lines; and
    a black bank layer disposed that extends into the holes formed in the planarization layer and coming in contact with the color filter layers via the holes.

2. The display panel of claim 1, wherein the at least one hole of the plurality of holes expose the color filter layers at a location to partially overlie two adjacent data lines.

3. The display panel of claim 2, wherein each of the holes exposes ends of two different color filters in the color filter layers.

4. The display panel of claim 3, wherein the black bank layer comes in contact with both of the two color filter layers exposed via each of the holes.

5. The display panel of claim 3, wherein the ends of the two color filter layers exposed via each of the holes overlap each other.

6. The display panel of claim 1 further including a white pixel area in the substrate.

7. An organic light-emitting display panel comprising:
    a substrate having a red pixel area, a blue pixel area and a green pixel area defined thereon;

one or more signal lines disposed on the substrate between two adjacent pixel areas;

a passivation layer disposed on the signal lines;

color filter layers disposed on the passivation layer;

a planarization layer disposed over the color filter layers;

a plurality of holes formed in the planarization layer that expose the color filter layers; and a black bank layer that extends into the holes formed in the planarization layer and coming in contact with the color filter layers via the holes.

8. The display panel of claim 7, wherein one of the holes exposes ends of two color filter layers defining colors of light produced from the blue pixel area and the green pixel area, respectively.

9. The display panel of claim 8, wherein the black bank layer comes in contact with both of the two color filter layers exposed via the hole.

10. The display panel of claim 8, wherein the ends of the two color filter layers exposed via the hole overlap each other.

11. The display panel of claim 8, wherein the planarization layer is located between two color filter layers defining colors of light produced from the red pixel area and the blue pixel area, respectively, and wherein another of the holes exposes an end of the color filter layer defining a color of light produced from the red pixel area, and an opposed end of the color filter layer defining the color of the light produced from the blue pixel area.

12. The display panel of claim 11, wherein the black bank layer covers the end of the color filter layer defining the color of the light produced from the red pixel area, and the opposed end of the color filter layer defining the color of the light produced from the blue pixel area exposed via the hole.

13. The display panel of claim 7, wherein one of the holes of the plurality of holes is aligned to overlie at least a portion of one signal line of the one or more signal lines.

14. An organic light-emitting display device comprising:

a substrate comprising a plurality of pixel areas defined thereon;

a driving thin-film transistor disposed on the substrate;

a passivation layer disposed on the driving thin-film transistor;

color filter layers disposed on the passivation layer;

a planarization layer disposed over the color filter layers;

a first hole in the planarization layer which permits the driving thin-film transistor to be exposed;

a plurality of second holes in the planarization layer which permits the color filter layers to be exposed;

a first electrode disposed on the planarization layer and electrically connected to the driving thin-film transistor via the first hole;

a black bank layer partially disposed on the first electrode and that extends into the holes formed in contact with the color filter layers via the second holes;

an organic emission layer disposed on the first electrode and the black bank layer; and a second electrode layer disposed on the organic emission layer.

15. The organic light-emitting display device of claim 14 further comprising one or more signal lines disposed on the substrate between two adjacent pixel areas and the passivation layer overlies the signal lines.

* * * * *